(12) United States Patent
Shone

(10) Patent No.: US 6,963,508 B1
(45) Date of Patent: Nov. 8, 2005

(54) OPERATION METHOD FOR NON-VOLATILE MEMORY

(76) Inventor: Fuja Shone, 2F, No. 40, Park Ave. II, Science-Based Industrial Park, Hsinchu 300 (TW)

( * ) Notice: Subject to any disclaimer, the term of this patent is extended or adjusted under 35 U.S.C. 154(b) by 0 days.

(21) Appl. No.: 10/829,191

(22) Filed: Apr. 22, 2004

(51) Int. Cl.$^7$ .............................................. G11C 11/34
(52) U.S. Cl. .............................. 365/185.28; 365/185.24
(58) Field of Search ...................... 365/185.22, 185.24, 365/185.28

(56) References Cited

U.S. PATENT DOCUMENTS

| 6,011,725 | A | 1/2000 | Eitan |
| 6,873,552 | B2 * | 3/2005 | Ishii et al. ............. 365/185.24 |
| 6,888,758 | B1 * | 5/2005 | Hemink et al. ........ 365/185.22 |

* cited by examiner

*Primary Examiner*—Michael Tran
(74) *Attorney, Agent, or Firm*—Volentine Francos & Whitt, PLLC

(57) ABSTRACT

An operation method for non-volatile memory is conducted as follows. First, a non-volatile memory cell capable of storing a first bit and a second bit is provided. The non-volatile memory cell comprises a first region and a second region with a channel therebetween and a gate above the channel but separated therefrom by a charge trapping layer, wherein the first bit and the second bit are positioned close to the first and second regions, respectively. Next, a first programmed voltage for the first bit, a second programmed voltage for the second bit and an erased voltage for the first and second bits are determined, wherein the first programmed voltage is smaller than the second programmed voltage. For reading the first bit, a voltage is applied to the second region, inducing a depletion region around the second region. For reading the second bit, a voltage is applied to the second region, wherein the voltage applied to the second region is smaller than that for reading the first bit.

12 Claims, 4 Drawing Sheets

OPERATION METHOD FOR NON-VOLATILE MEMORY

BACKGROUND OF THE INVENTION (A) Field of the Invention

The present invention is related to an operation method for non-volatile memory, and more particularly to an operation method for non-volatile memory capable of storing two bits.

(B) Description of the Related Art

Non-volatile memory devices are currently in wide use in electronic components that require the retention of information when electrical power is terminated. Non-volatile memory devices include read only memory (ROM), programmable read only memory (PROM), erasable programmable read only memory (EPROM) and electrically erasable programmable read only memory (EEPROM) devices. EEPROM devices differ from other non-volatile memory devices in that they can be electrically programmed and erased. Flash EEPROM devices are similar to EEPROM devices in that memory cells can be programmed and erased electrically. However, Flash EEPROM devices enable the erasing of all memory cells in the device using a single electrical current pulse.

Typically, an EEPROM device includes a floating-gate electrode upon which electrical charge is stored. In a flash EEPROM device, electrons are transferred to a floating-gate electrode through a dielectric layer overlying the channel region of the transistor. The electron transfer is initiated by either hot electron injection or Fowler-Nordheim (F-N) tunneling. One important dielectric material for the fabrication of the floating-gate electrode is an oxide-nitride-oxide (ONO) structure. During programming, electrical charges are transferred from the substrate to the silicon nitride layer in the ONO structure and trapped therein. Moreover, non-volatile memory designers have taken advantage of the localized nature of electron storage within a silicon nitride layer and have designed memory circuits that utilize two regions of stored charge within an ONO layer. This type of non-volatile memory device is known as a two-bit EEPROM. The two-bit EEPROM is capable of storing twice as much information as a conventional EEPROM in a memory array of equal size. A left bit and right bit are stored in physically different areas of the silicon nitride layer, near left and right regions of each memory cell.

Referring to FIG. 1, U.S. Pat. No. 6,011,725 introduces an operation method to an EEPROM device 10, or namely SONOS (silicon-oxide-nitride-oxide-silicon) device, having a non-conducting charge trapping dielectric, such as a silicon nitride layer 20, sandwiched between two silicon oxide layers 18 and 22 acting as electrical insulators. In view of localized trapping electron charge capability of the silicon nitride layer 20, the EEPROM device 10 is capable of storing two bits of information, i.e., there are two bits per cell. A left bit and a right bit are stored in physically different areas of the silicon nitride layer 20, near left and right regions of the memory cell 10, respectively. For programming, voltages are applied to a gate 24 and a drain 16 to create vertical and lateral electrical fields, which accelerate electrons from a source 14 along the length of the channel. As the electrons move along the channel, some of them gain sufficient energy to jump over the potential barrier of the bottom silicon oxide layer 18 and become trapped in the silicon nitride layer 20. For the right bit, for example, the electrons are trapped near the drain 16 indicated by the dashed circle 23. For the left bit, on the contrary, electrons are trapped in the nitride layer 20 near the source 14 as dashed cycle 21. For reading, a way to read in reverse direction, i.e., in a direction opposite to that of programming, is conducted. For instance, to read the right bit of the device 10, voltages are applied to the source 14 and the gate 24, whereas the drain 16 is grounded, in which the voltage applied to the source 14 has to be high enough to ignore the affection by the left bit charge. If there is charge in right bit, no current occurs. In contrast, current is generated if there is no charge in right bit. As to the reading of the left bit, voltages are applied to the drain 16 and the gate 24, whereas the source 14 is grounded.

Accordingly, the above-mentioned technique limits that the reading has to be conducted in a reverse direction, which may enhance the complex of operation.

SUMMARY OF THE INVENTION

The objective of the present invention is to provide an alternative operation method for a non-volatile memory device capable of storing two bits, so as to simplify the operation.

To achieve the above objective, an operation method for non-volatile memory can be conducted as follows. First, a non-volatile memory cell capable of storing a first dielectric bit and a second bit is provided. The non-volatile memory cell comprises a first region, e.g., a source, and a second region, e.g., a drain, with a channel therebetween and a gate above the channel but separated therefrom by a charge trapping layer sandwich between a first and a second dielectric layer, wherein the first bit and the second bit are positioned close to the first and second regions, respectively. Next, a first programmed voltage for the first bit, a second programmed voltage for the second bit and an erased voltage for the first and second bits are determined, wherein the first programmed voltage is smaller than the second programmed voltage.

For reading the first bit, voltages are applied to the second region and to the gate, and the first region is grounded, wherein the voltage applied to the gate is between the erased voltage and the first programmed voltage, and the voltage applied to the second region induces a depletion region around the second region, with a view to ignoring the influence of the second bit if programmed. When the first bit is being read, the first bit is not programmed if there is a current flowing through the channel, whereas the first bit is programmed if there is no current flowing through the channel.

For reading the second bit, voltages are also applied to the second region and to the gate and the first region is grounded, wherein the voltage applied to the gate is between the first programmed voltage and the second programmed voltage, and the voltage applied to the second region is relatively small, e.g., 0.1–0.5 volts, to increase the current in the channel, if any. Further, the voltage applied to the second region has to be smaller than that when the first bit is being read to avoid that the depletion region formed around the second region is too large to read the second bit. When the second bit is being read, the second bit is not programmed if there is a current flowing through the channel, whereas the second bit is programmed if there is no current flowing through the channel.

Accordingly, in any case of reading the first or second bit, voltages are applied to the same electrodes, i.e., reading in the same forward direction, and to sense which bit is manipulated only by varying the applying voltages. Therefore, the operation method put forth in the present invention provides an alternative for the prior art, and simplifies the reading operation.

DETAILED DESCRIPTION OF THE INVENTION

Embodiments of the present invention are now being described with reference to the accompanying drawings.

Figure 1:
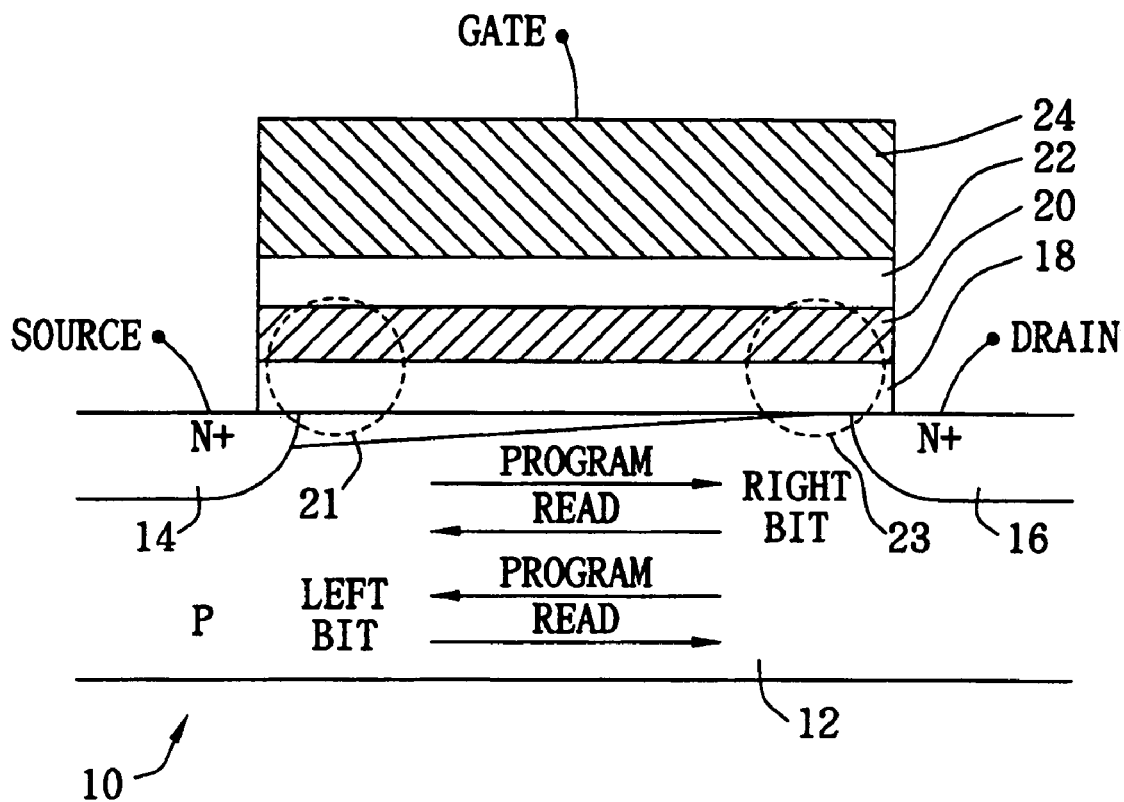
FIG. 1 illustrates a known SONOS memory cell and operation method thereof.
Figure 2:
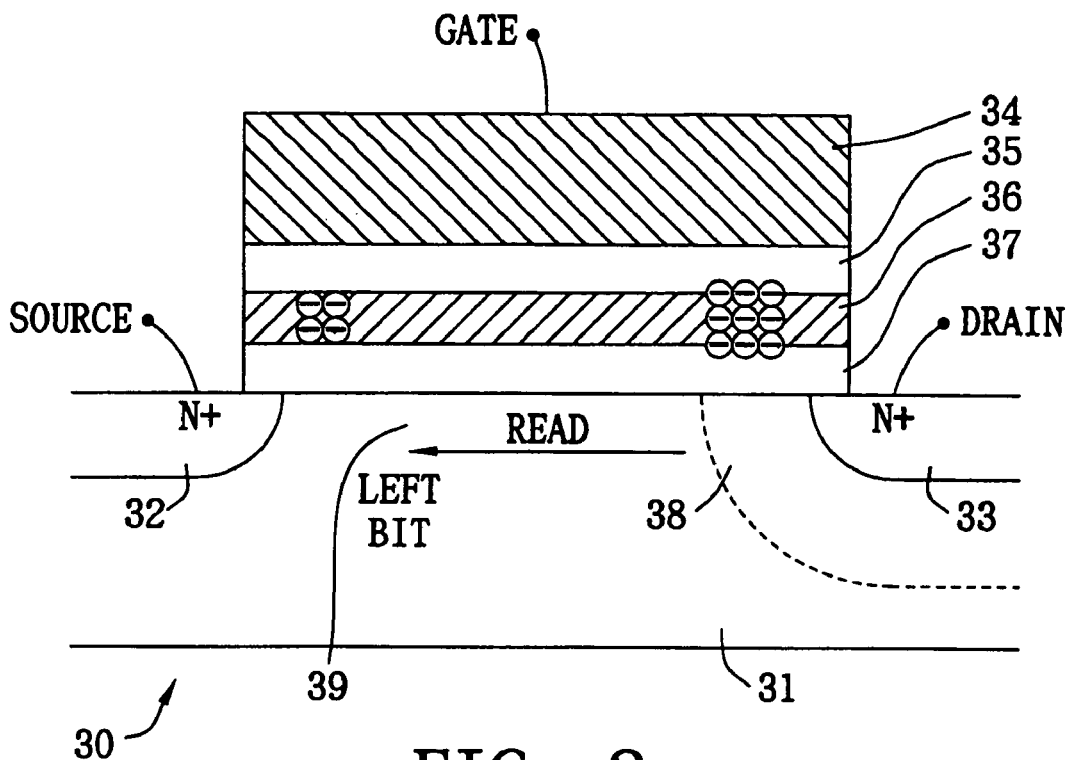
FIG. 2 illustrates a known non-volatile memory cell and operation method thereof for reading the left bit in accordance with the present invention.

Referring to FIG. 2, a non-volatile memory cell 30 of NMOS type is built up on a silicon substrate 31, in which a source 32 and a drain 33 are formed, and a gate 34, an first dielectric layer 35, a charge trapping layer 36 and a second dielectric layer 37 are formed thereon. The charge trapping layer 36 may be composed of silicon nitride, and the first and second dielectric layers 35, 37 may be made of silicon dioxide. The non-volatile memory cell 30 can be programmed by the way of conventional art, for example, the drain 33 and gate 34 are respectively applied by voltages $V_D$ and $V_G$, e.g., larger than or equal to 5V and 5V, respectively, so as to program the left bit near the source 32 to a voltage of 3.5V. The right bit near the drain 33 can be programmed to a voltage of 5.5V by applying voltages larger than 6V to the drain 33 and 5V to the gate 34, respectively. The programming conditions are summarized in Table 1.

TABLE 1

|  | Drain | Gate | Source | Substrate |
| --- | --- | --- | --- | --- |
| Left bit | $V_D \geq 5$ V | $V_G > 5$ V | 0 V | 0 V |
| Right bit | $V_D \geq 6$ V | $V_G > 5$ V | 0 V | 0 V |

Accordingly, the programmed voltage of the left bit denoted by Vtlp is 3.5V, and the programmed voltage of the right bit denoted by Vtrp is 5V. Assuming an erased voltage for the first and second bits denoted by Vte is 1.5V. To read the left bit, the drain voltage $V_D$ is greater than 1V to make a depletion region 38 around the drain 33 for ignoring the effect of the charge of the right bit if programmed, and a gate voltage $V_G$ between Vte and Vtlp, e.g., 2.5V, is applied to the gate 34. Accordingly, if the left bit is not programmed, current $I_{DS}$ will be generated in the channel 39 between the source 32 and drain 33 in the light of the formula (1).

$$I_{DS} = \frac{W}{L}\mu C_{OX}\left[(V_G - V_T)\times V_{DS} - \frac{1}{2}V_{DS}^2\right] \quad (1)$$

wherein

W is the channel width of the memory cell;
L is the channel length of the memory cell;
$\mu$ is mobility;
Cox is capacitance of gate oxide;
$V_G$ is voltage applied to the gate;
$V_T$ is threshold voltage;
$V_{DS}$ is voltage between the source and drain.

On the contrary, no current occurs if the left bit is programmed.

Figure 3:
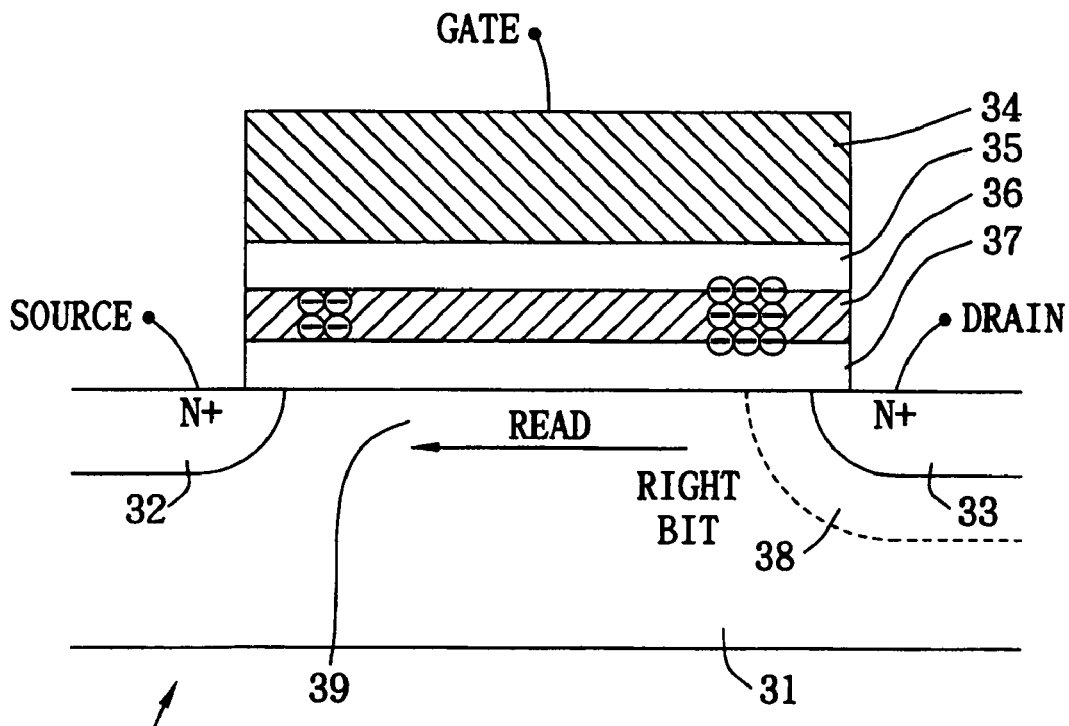
FIG. 3 illustrates a known non-volatile memory cell and operation method thereof for reading the right bit in accordance with the present invention.

As shown in FIG. 3, to read the right bit, a relatively small drain voltage $V_D$, e.g., 0.1–0.5V, is applied, and the gate voltage $V_G$ has to be greater than Vtlp, e.g., 4.5V, to ensure that the left bit is turned on regardless of whether the left bit is programmed or not, with a view to ignoring the influence of the left bit. Further, the $V_G$ is smaller than Vtrp to verify the state of the right bit, i.e., Vtlp<$V_G$<Vtrp. The application of the small drain voltage VD is intended to obtain a larger current, but the amount of $V_D$ has to be limited because too large of $V_D$ may give rise to a too broad depletion region around the drain 33 that obstructs the reading of the right bit. Hence, at least, the $V_D$ for reading the right bit has to be smaller than the $V_D$ for reading the left bit. Accordingly, no current occurs if the right bit is programmed, whereas current is generated in the light of the formula (1) if the right bit is not programmed. As a result, both reading the right and left bits are conducted by controlling the drain voltage and gate voltage, i.e., reading in the same forward direction. The above reading conditions are summarized in Table 2.

TABLE 2

|  | Drain | Gate | Source | Substrate |
| --- | --- | --- | --- | --- |
| Left bit | $V_D > 1$ V | Vte < $V_G$ < Vtlp | 0 V | 0 V |
| Right bit | $V_D > 0.1$ V | Vtlp < $V_G$ < Vtrp | 0 V | 0 V |

To sum up, to sense whether there is a bit programmed at source edge, word line voltage, i.e., gate voltage, is set at the middle range of erased voltage and programmed voltage of source edge where drain voltage, i.e., 1.2V, is biased to ignore whether the bit at drain edge is programmed or not. On the other hand, to sense whether there is a bit programmed at drain edge, word line voltage is set at the middle range of programmed voltages of drain and source to make sure that the source edge is turned on if programmed. At the same time, a small voltage is biased at the drain edge to deplete the drain slightly, thereby the impact to drain voltage once the bit at drain edge is programmed can be avoided. Preferably, the $V_D$ for reading the left bit is between 0.6–2V, and reading the right bit is between 0.1–0.5V, the Vtlp is between 2–4V, the Vtrp is between 4–6V and the Vte is between 0.5–2V.

Figure 4:
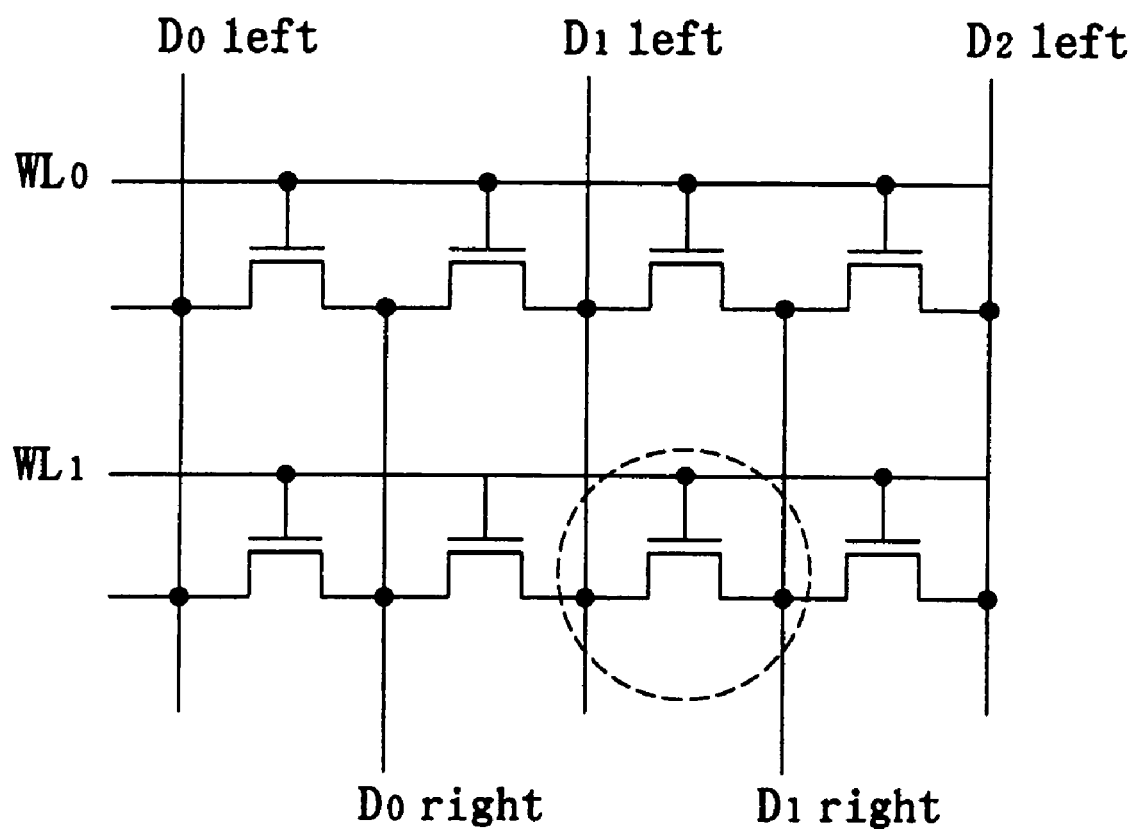
FIG. 4 illustrating a non-volatile memory array, which intends to exemplify the operation method in accordance with the present invention.

FIG. 4 illustrates an array of 2-bit per cell, which are constituted of word lines $WL_0$, $WL_1$, and bit lines $D_{0\ left}$, $D_{0\ right}$, $D_{1\ left}$, $D_{1\ right}$ and $D_{2\ left}$. Assuming the Vte, Vtlp and Vtrp are 1.5V, 3.5V and 5.5V, respectively, examples for reading, programming and erasing of memory cell $WL_1$, $D_{1\ left}$, $D_{1\ right}$, i.e., the one with dash line circle in FIG. 4, are shown in Table 3.

TABLE 3

| Function |  | $WL_0$ | $WL_1$ | $D_{1\ left}$ | $D_{1\ right}$ | $D_{0\ right}$ | $D_{2\ left}$ | $V_{sub}$ |
| --- | --- | --- | --- | --- | --- | --- | --- | --- |
| Read | Left bit | 0 V | 2.5 V | 0 V | 1.2 V | 0 V | 0 V | 0 V |
|  | Right bit | 0 V | 4.5 V | 0 V | 0.5 V | 0 V | 0 V | 0 V |

TABLE 3-continued

| Function | | WL$_0$ | WL$_1$ | D$_{1\,left}$ | D$_{1\,right}$ | D$_{0\,right}$ | D$_{2\,left}$ | V$_{sub}$ |
|---|---|---|---|---|---|---|---|---|
| Program | Left bit | 0 V | 8 V | 5 V | 0 V | floating | 0 V | 0 V |
|  | Right bit | 0 V | 8 V | 0 V | 6 V | 0 V | floating | 0 V |
| Erase | one WL erase | 0 V | −8 V | 0 V | 0 V | 0 V | 0 V | 0 V |

In addition to the application to a non-volatile memory cell of NMOS type as the above mentioned, a memory cell of PMOS type also can be implemented without departing from the spirit of the present invention.

Moreover, the operation method put forth in the present invention is not limited to be applied to a two-bit cell, and can be applied to multi-bit cell also, i.e., there are multiple bits near the source 32 and multiple bits near the drain 33, without departing from the scope of the present invention.

Figure 5:
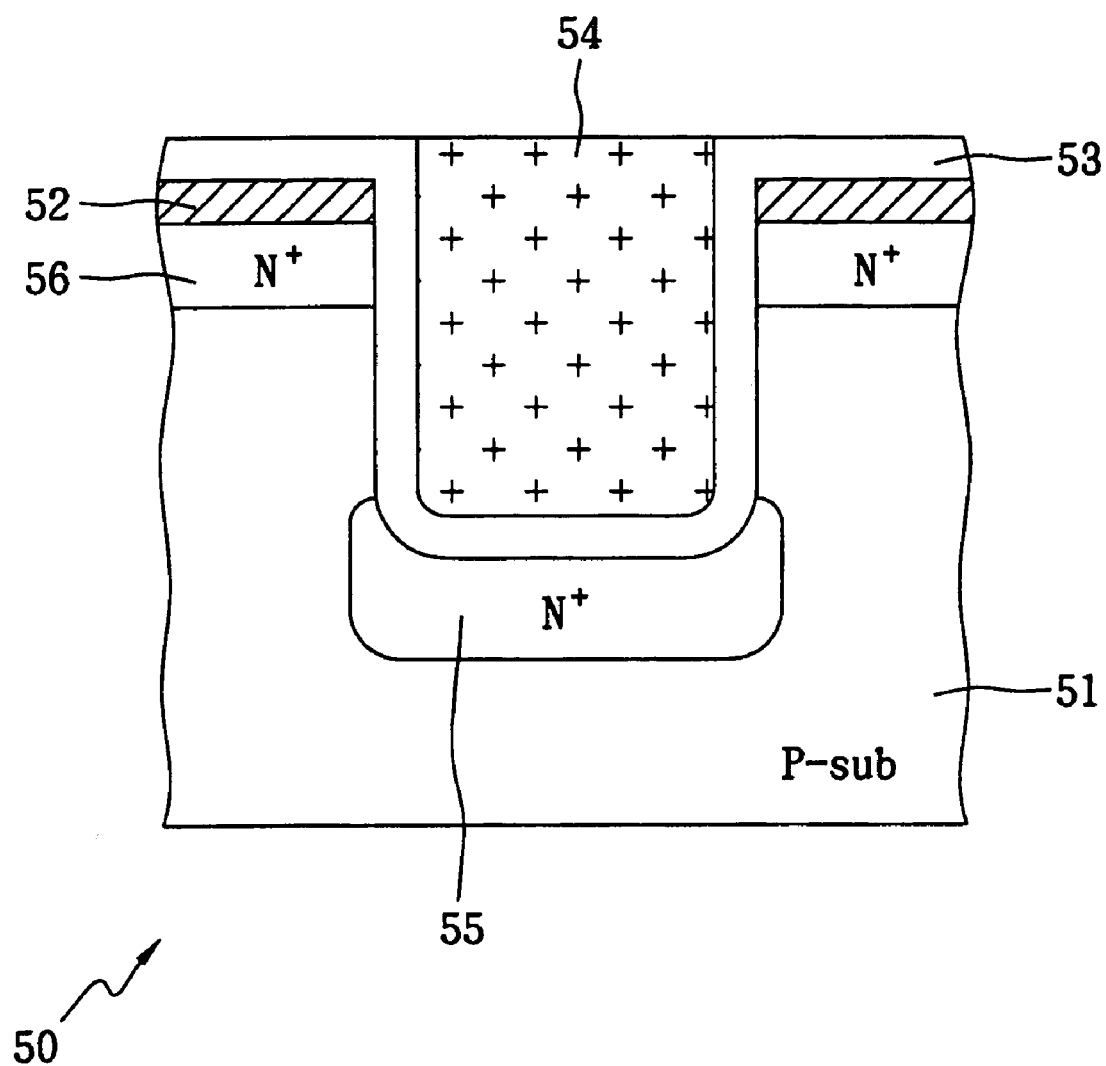
FIG. 5 illustrates a vertical memory cell that can apply the operation method in accordance with the present invention.

As shown in FIG. 5, a vertical memory cell 50 is built in a P-type substrate 51, and the substrate 51 comprises a top N+ region 56, a bottom N+ region 55, a mask layer 52, an ONO layer 53 and a polysilicon block 54. The top and bottom N+ regions 56 and 55 may act as a source and a drain, and the areas in ONO layer 53 near the top and bottom N+ regions 56 and 55 are able to store bits of information, respectively. The polysilicon block 54 acts as a gate. In the case of applying the operation method of the present invention to the vertical memory cell 50, the bit near the top N+region 56 is deemed the left bit, whereas the bit near the bottom N+ region 55 is deemed the right bit.

The above-described embodiments of the present invention are intended to be illustrative only. Numerous alternative embodiments may be devised by those skilled in the art without departing from the scope of the following claims.

What is claimed is:

1. An operation method for non-volatile memory, comprising the steps of:
   providing a non-volatile memory cell capable of storing at least a first bit and a second bit and having a first region and a second region with a channel therebetween and a gate above the channel but separated therefrom by a charge trapping layer sandwiched between a first dielectric layer and a second dielectric layer, wherein the first bit and the second bit are positioned close to the first and second regions respectively;
   determining a first programmed voltage for the first bit, a second programmed voltage for the second bit and an erased voltage for the first and second bits, wherein the first programmed voltage is smaller than the second programmed voltage;
   reading the first bit by applying a voltage to the second region; and
   reading the second bit by applying a voltage to the second region, wherein the voltage applied to the second region for reading the second bit is smaller than that for reading the first bit.

2. The operation method for non-volatile memory in accordance with claim 1, wherein the voltage applied to the second region for reading the first bit is so large that a depletion region around the second region is induced and whether the second bit is programmed or not is ignored.

3. The operation method for non-volatile memory in accordance with claim 1, wherein a voltage is further applied to the gate for reading the first bit, and the voltage applied to the gate for reading the first bit is between the erased voltage and the first programmed voltage.

4. The operation method for non-volatile memory in accordance with claim 1, wherein a voltage is further applied to the gate for reading the second bit, and the voltage applied to the gate for reading the second bit is between the first programmed voltage and the second programmed voltage.

5. The operation method for non-volatile memory in accordance with claim 1, wherein the voltage applied to the second region for reading the second bit is between 0.1 and 0.5 volts.

6. The operation method for non-volatile memory in accordance with claim 1, wherein the voltage applied to the second region for reading the first bit is between 0.6 and 2 volts.

7. The operation method for non-volatile memory in accordance with claim 1, wherein the first programmed voltage is between 2 and 4 volts.

8. The operation method for non-volatile memory in accordance with claim 1, wherein the second programmed voltage is between 4 and 6 volts.

9. The operation method for non-volatile memory in accordance with claim 1, wherein the erased voltage is between 0.5 and 2 volts.

10. The operation method for non-volatile memory in accordance with claim 1, wherein the charge trapping layer is composed of silicon nitride.

11. The operation method for non-volatile memory in accordance with claim 1, wherein the non-volatile memory cell is of N-type.

12. The operation method for non-volatile memory in accordance with claim 1, wherein the non-volatile memory cell is a vertical memory cell.

* * * * *